(12) United States Patent
Newman

(10) Patent No.: US 6,656,267 B2
(45) Date of Patent: Dec. 2, 2003

(54) TRAY FOR MACROMOLECULE CRYSTALLIZATION AND METHOD OF USING THE SAME

(75) Inventor: Janet Newman, Encinitas, CA (US)

(73) Assignee: Structural Genomix, Inc., San Diego, CA (US)

( * ) Notice: Subject to any disclaimer, the term of this patent is extended or adjusted under 35 U.S.C. 154(b) by 0 days.

(21) Appl. No.: 09/903,341

(22) Filed: Jul. 10, 2001

(65) Prior Publication Data

US 2003/0010278 A1 Jan. 16, 2003

(51) Int. Cl.⁷ .................................................. C30B 9/00

(52) U.S. Cl. .................. 117/11; 117/1; 117/5; 117/206; 117/925; 117/927; 117/422; 117/245.1

(58) Field of Search ........................ 117/1, 5, 11, 206, 117/925, 927; 422/245.1

(56) References Cited

U.S. PATENT DOCUMENTS

| | | |
|---|---|---|
| 3,415,361 A | 12/1968 | Adams, Jr. et al. |
| 3,938,961 A | 2/1976 | Lanier |
| 5,047,215 A | 9/1991 | Manns |
| 5,096,676 A | 3/1992 | McPherson et al. |
| 5,221,410 A | 6/1993 | Kushmer et al. |
| 5,244,630 A | 9/1993 | Khalil et al. |
| 5,400,741 A | 3/1995 | DeTitta et al. |
| 5,419,278 A | 5/1995 | Carter |
| 6,039,804 A | 3/2000 | Kim et al. |
| 6,143,250 A | 11/2000 | Tajima |

FOREIGN PATENT DOCUMENTS

WO    WO 02/102503    12/2002

OTHER PUBLICATIONS

"CombiClover Crystallization Plate," *Emerald BioStructures,,* http://emeraldbiostructures.com/combi_plates.htm.

"A Study of Protein Crystallization in Clover Crystallization Plates and Traditional Crystallization Plates," *Emerald BioStructures,,* http://emeraldbiostructures.com/cloverwhite1b.htm.

"CombiClover crystallization plate," *Emerald BioStructures,,* http://emeraldbiostructures.com/cloverwhite2b.htm.

"CompactClover crystallization plate," *Emerald BioStructures,,* http://emeraldbiostructures.com/cloverwhite3b.htm, printed Jul. 31, 2000.

"Clarified polypropylene plastic," *Emerald BioStructures,,* http://emeraldbiostructures.com/cloverwhite4b.htm, printed Jul. 31, 2000.

"Results of testing of Clover plates in protein crystallization applications," *Emerald BioStructures,,* http://emeraldbiostructures.com/cloverwhite5b.htm, printed Jul. 31, 2000.

"Comparisons of crystallization results using Clover and traditional plates," *Emerald BioStructures,,* http://emeraldbiostructures.com/cloverwhite6b.htm, printed Jul. 31, 2000.

(List continued on next page.)

*Primary Examiner*—Felisa Hiteshew
(74) *Attorney, Agent, or Firm*—Procopio, Cory, Hargreaves & Savitch, LLP (57) ABSTRACT

A crystallization tray includes a plurality of crystallization cells, each cell having a reservoir adapted to receive an equilibrating solution, a shelf located adjacent to the reservoir and adapted for use as a temporary cryogenic holding area for a crystallized substance and/or a sample holding area, and a sample drop receptacle carried by the shelf and adapted to receive a sample drop including a crystallizable substance. A related method for forming macromolecular crystals includes dispensing an equilibrating solution in the reservoirs, dispensing a plurality of macromolecular solution droplets in the sample drop receptacles, covering the cells with a cover; and crystallizing the crystallizable substance by vapor diffusion.

22 Claims, 3 Drawing Sheets

OTHER PUBLICATIONS

"Test of crystallization not being affected by other protein samples in CombiClover plate," *Emerald BioStructures,,* http://emeraldbiostructures.com/cloverwhite7b.htm, printed Jul. 31, 2000.

"Testing of vapor diffusion cross–talk between quadrants in the CompactClover crystallization chamber," *Emerald BioStructures,,* http://emeraldbiostuctures.com/cloverwhite8b.htm, printed Jul. 31, 2000.

"Crystallization of research proteins in Clover plates," *Emerald BioStructures,,* http://emeraldbiostructures.com/cloverwhite9b.htm, printed Jul. 31, 2000.

"Conclusions of Clover plate testing," *Emerald BioStructures,,* http://emeraldbiostructures.com cloverwhite10b.htm, printed Jul. 31, 2000.

Michael B. Berry, "Protein Crystallization: Theory and Practice," (1995) http://www–bioc.rice.edu/~berry/papers/crystallization/crystallization.html, printed Jul. 31, 2000.

Computer printout; CrystalQuick Standard Profile—Round Bottom Plate; Feb. 6, 2003; http://www.hamptonresearch.com/hrproducts/3281.html.

TRAY FOR MACROMOLECULE CRYSTALLIZATION AND METHOD OF USING THE SAME

FIELD OF THE INVENTION

The present invention relates, in general, to crystallization trays, and, in particular, to trays for forming diffraction-quality macromolecule crystals by vapor-diffusion techniques.

BACKGROUND OF THE INVENTION

Supersaturated solutions of biological macromolecules (e.g., proteins, nucleic acids) under defined conditions form macromolecular crystals. Macromolecular crystals have been used in the biotechnology/pharmaceutical industry for many purposes. For example, three-dimensional structural models of macromolecule structures derived from X-ray crystallography are used to design new drugs and compositions in pharmaceutical and agricultural research; crystallization steps are utilized in purification/manufacturing processes of biotechnology-derived products; and crystalline complexes are used for controlled-release drug formulations and agricultural products, such as, for example, herbicides and insecticides.

One of the first and most important steps in the X-ray crystal structure determination of a target macromolecule is to grow suitably large, well-diffracting crystals of the macromolecule. Compared to the technological advances achieved in making, collecting, and analyzing X-ray diffraction data more rapid and automated, crystal growth has become a rate-limiting step in the structure determination process.

Vapor diffusion is the most widely used technique for crystallization in modern macromolecular X-ray crystallography. In this technique, a small volume of the macromolecule sample is mixed with an approximately equal volume of a crystallization solution to form a sample solution. A drop of the sample solution is sealed in a cell with a much larger reservoir volume of the crystallization solution. The drop is kept separate from the reservoir of crystallization solution either by hanging the drop from a cover slip ("hanging drop" technique) or by sitting the drop on a pedestal ("sitting drop" technique) above the level of the crystallization solution in the reservoir. Over time, the crystallization drop and the equilibrating solution equilibrate via vapor diffusion of volatile chemical species. Supersaturating concentrations of the macromolecule are achieved, resulting in crystallization of the macromolecule sample in the drop.

Typically, several hundreds of experiments must be performed before conditions are found to produce high-quality crystals. Some of the conditions that are screened to determine the optimal conditions for crystal growth are pH, temperature, concentration of salts in the crystallization drop, concentration of the macromolecule to be crystallized, and concentration of the precipitating agent (of which there may be hundreds). Testing numerous combinations of conditions that affect crystal growth, by means of hundreds to thousands of crystallization experiments, eventually leads to the optimal conditions for crystal growth. Consequently, the ability to rapidly and easily generate many crystallization trials is important in determining the ideal conditions for crystallization.

Crystallization trays have been developed in the past in an effort to permit the efficient testing of numerous combinations of conditions that affect crystal growth. A problem with past trays is that the number of crystallization cells or chambers in a tray were too large and too few (e.g., 24 cells), causing the trays to be too large and/or limiting the number of crystallization experiments performed on a given tray. Another problem with past trays is that the crystallization cells did not have good viewing characteristics for viewing the crystallization process under a microscope or by using an imaging system. The cells often included solution reservoirs or sample receptacles that were too curved and/or were not clear, inhibiting viewing the crystallization process. A further problem with many past trays is that they are not sized to the standards set forth by the Society for Biomolecular Screening (SBS). Consequently, these trays can not be easily used with automated robotic equipment designed for trays meeting these standards. A still further problem with some past trays is that the trays are not formed as an integrated, single piece. For example, one tray in the past included multiple rows of crystallization cells that were removable from the tray base during use. The manufacture of multiple pieces made this tray expensive and susceptible to the cell rows accidentally dislodging from the tray base. Another problem with many trays in the past is that they are not appropriately designed for more general crystallography. Trays used for the hanging drop method have the disadvantage of not being easily used in automated processes because they require an automated mechanism for inverting the surface on which the drop is placed, such as a cover slip. But, many trays used for sitting drops are also not appropriate for maintaining the appropriately shaped drop. For example, in some crystallography trays, the floor of the sample solution receptacle is too flat and/or the floor includes sharp, angled corners. This may cause the sample solution to smear, cause a thin film to form, and/or cause the drop to migrate to the corner(s), inhibiting or preventing successful crystallization. If the drop migrates to a corner or corners, consistent visualization with a microscope is difficult because a consistent place may not exist in the cell for predicting where the sample is for visualization. In addition, commercially available trays do not provide for a simple way to seal individual cells without requiring the use of individual cover slips.

SUMMARY OF THE INVENTION

An aspect of the invention involves a crystallization cell including a reservoir adapted to receive an equilibrating solution, a shelf located adjacent to the reservoir and adapted for use as a temporary cryogenic holding area for a crystallized substance, and a sample drop receptacle carried by the shelf and adapted to receive a sample drop including a crystallizable substance.

Another aspect of the invention involves a crystallization tray. The crystallization tray includes a plurality of crystallization cells, each cell having a reservoir adapted to receive an equilibrating solution, a shelf located adjacent to the reservoir and adapted for use, for example, as a flat sample holding surface, and/or as a temporary cryogenic holding area for a crystallized substance, and a sample drop receptacle carried by the shelf and adapted to receive a sample drop including a crystallizable substance.

An additional aspect of the invention involves a crystallization tray including a base with a plurality of rectangular crystallization cells, a top wall, and a rectangular ridge extending upwardly from the top wall and delineating each cell. The ridge is adapted to support a cover for isolating each cell from ambient and from each other. The cover is preferably clear; preferred covers are self-adhesive, such as adhesive tape or plate sealer (available from, for example, 3M). The cover may also be one or a plurality of cover slips, covering either all of the crystallization cells, individual cells, or groups of cells such as rows or columns. Where the cover is not adhesive, the ridges of the tray could be greased with, for example, petroleum jelly, sealing medium, or grease, or gaskets could be used to attach the cover.

A still further aspect of the invention involves a method for forming macromolecular crystals. The method includes providing a macromolecule crystallization tray having a plurality of crystallization cells, each cell including a reservoir adapted to receive an equilibrating solution, a shelf located adjacent to the reservoir and adapted for use as a flat sample holding surface and/or as a temporary cryogenic holding area for a crystallized substance, and a sample drop receptacle carried by the shelf and adapted to receive a sample drop including a crystallizable substance; dispensing an equilibrating solution in the reservoirs, dispensing a plurality of macromolecular solution droplets in the sample drop receptacles, covering the cells with a cover; and crystallizing the crystallizable substance by vapor diffusion.

These and further objects and advantages will be apparent to those skilled in the art in connection with the drawing and the detailed description of the preferred embodiment set forth below.

DETAILED DESCRIPTION OF THE PREFERRED EMBODIMENT

Figure 1:
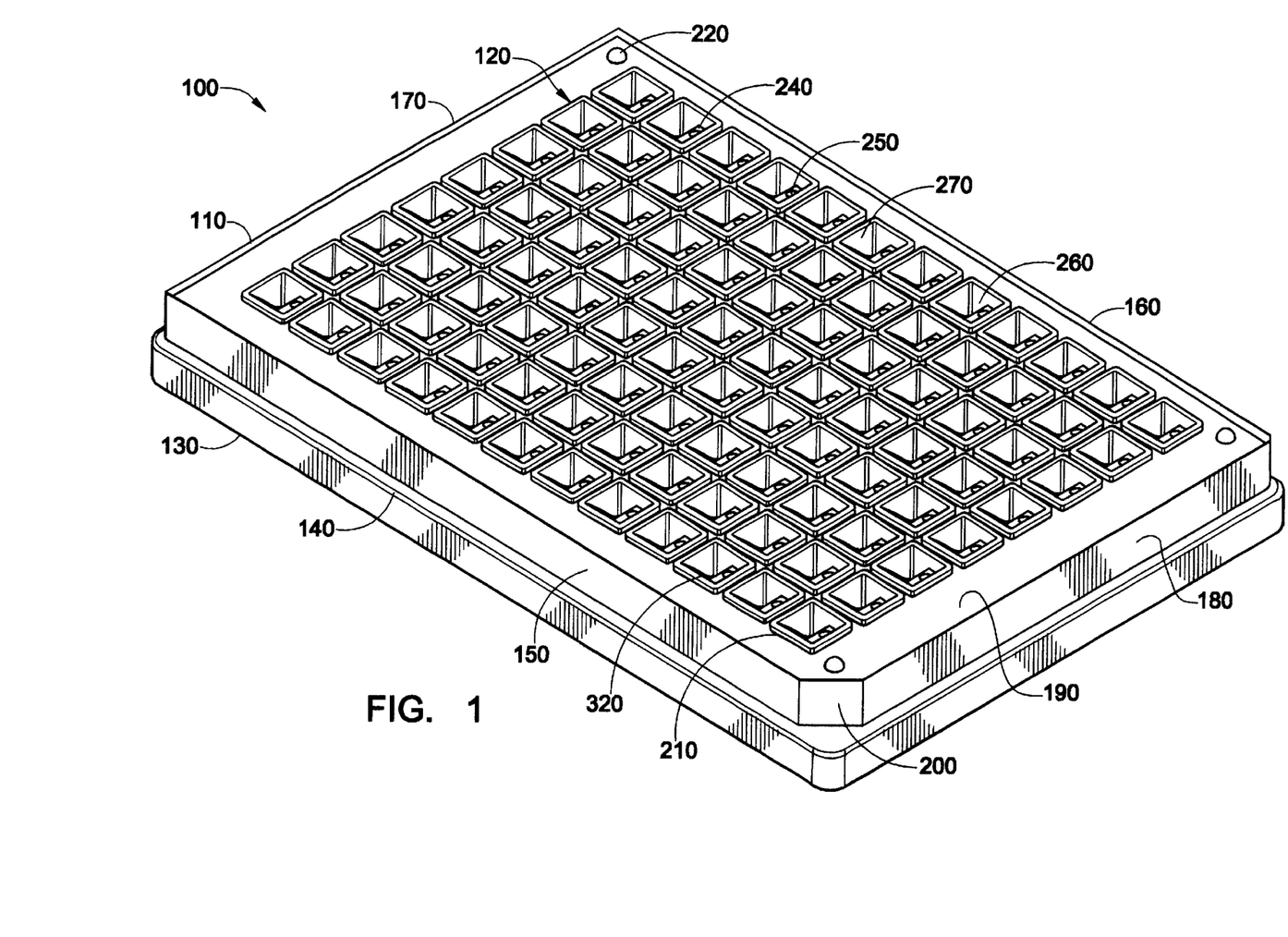
FIG. 1 is a perspective view of an embodiment of a macromolecule crystallization tray.

With reference to FIG. 1, a crystallization tray 100 constructed in accordance with an embodiment of the invention will now be described. The tray 100 is especially useful in crystallizing biological macromolecules such as proteins and nucleic acids; however, the tray 100 may be used to crystallize any crystallizable substance. Some general material properties of the tray 100 will first be described, followed by a description of the elements of the tray 100 and the tray 100 in use.

The tray 100 preferably has a single-piece, integrated construction and is manufactured using an injection molding process. The tray 100 is preferably made from an optically clear, plastic material such as, but not by way of limitation, a clear polystyrene material or polypropylene polymer. An optically clear, inert, plastic material allows crystal growth to be viewed under a microscope. Crystal growth may also be viewed using an imaging system, such as, for example, a video camera operably linked to a computer having a computer monitor that can display the image. The plastic material of the tray 100 preferably is a low-wettability material having a relatively high contact angle with respect to water so that the solution of the sample to be crystallized will tend to form discrete drops when placed in contact with the crystallization tray 100. The plastic material selected should be moldable so that the inner surfaces of the tray 100 that come into contact with the macromolecule solution have a smooth texture. The material used should be resistant to chemicals such as methyl pentane diol, organic acids and alcohols, and should be stable for long term storage in pH 3–10 solutions.

The tray 100 includes a rectangular base 110 with an array of crystallographic cells 120 and a rectangular skirt 130 joined with the base 110 through a step 140. The rectangular dimensions of the base 110 are slightly smaller than the rectangular dimensions of the skirt 130, and the undersurface of the rectangular skirt 130 is open and hollow, allowing for stacking of multiple trays 100.

The base 110 includes a first side wall 150, a second side wall 160, a first end wall 170, a second end wall 180, and a top wall 190. Where the first side wall 150 and first end wall 170 would normally intersect, the base 110 includes a single beveled or cut corner 200 for orienting the tray 100 (e.g., always knowing which way is up) and to denote a first cell 210 in the array. In a preferred embodiment, the tray 100 includes ninety-six cells 120 organized in twelve columns denoted respectively by the numbers 1–12 and eight rows denoted respectively by the letters A–H. The beveled corner 200 preferably indicates the position of the A-1 cell (i.e., the first cell, the cell in the first row and first column, or the cell located in column A, row 1). The top wall 190 preferably includes three knobs 220 that are used for orienting the tray 100 in the imaging system.

Figure 2:
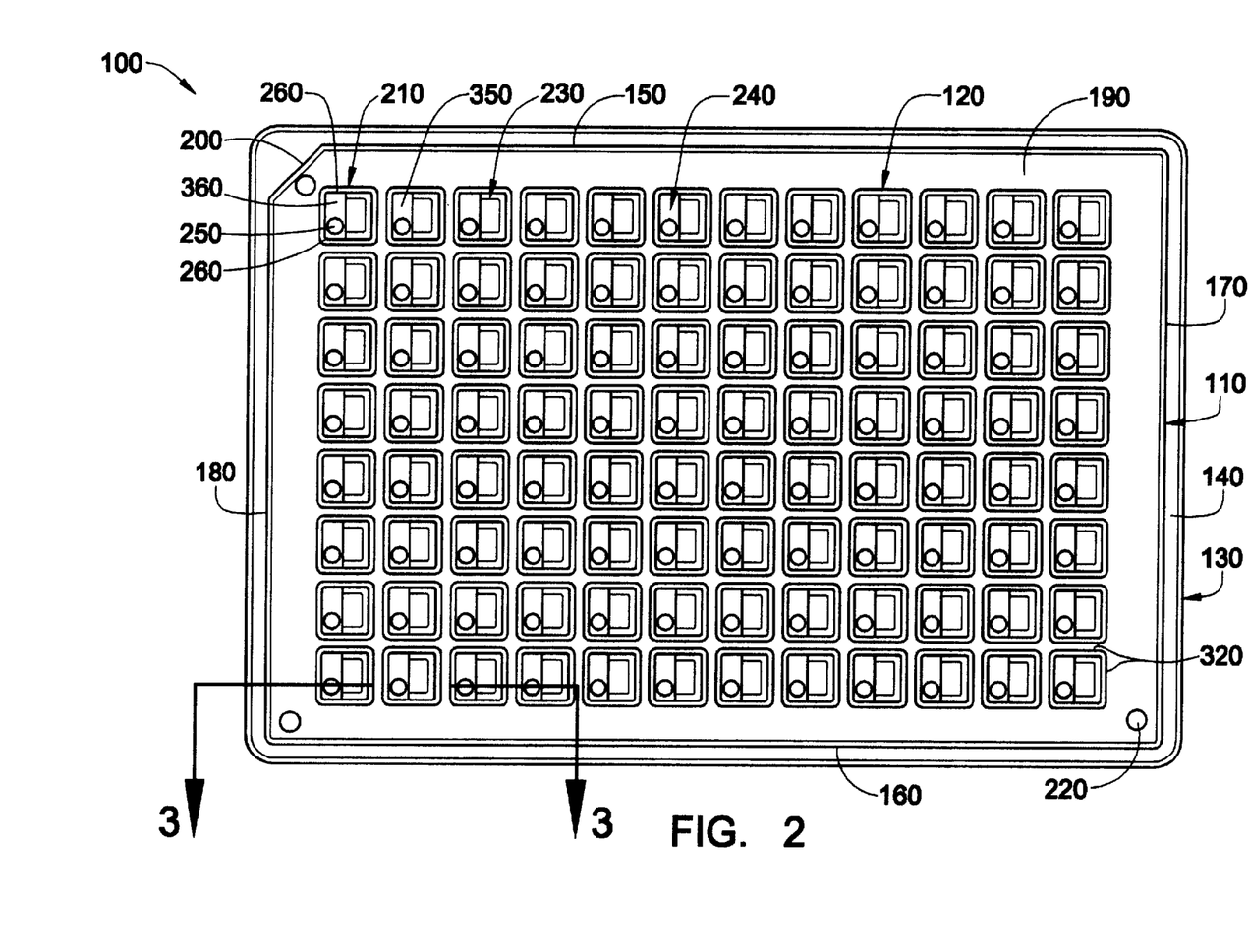
FIG. 2 is a top plan view of the tray illustrated in FIG. 1.
Figures 3, 4, 5:
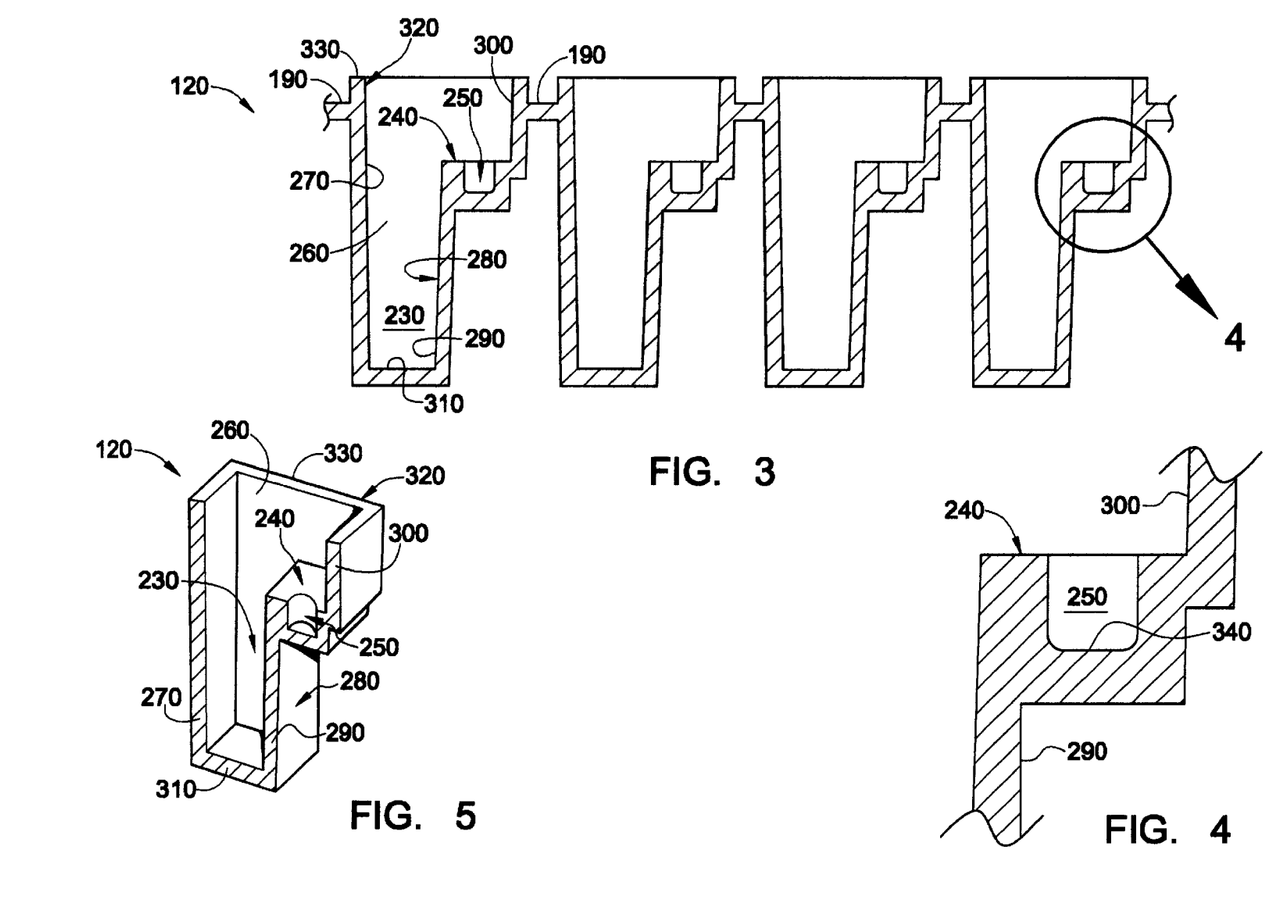
FIG. 3 is a partial, cross-sectional view of the tray taken along line 3—3 of FIG. 2.
FIG. 4 is an enlarged cross-sectional view of the area denoted as 4 in FIG. 3.
FIG. 5 is a perspective view of a sliced section of a well of the tray illustrated in FIG. 1.

With reference to FIGS. 2–5 and especially FIGS. 3–5, the crystallization cells 120 will now be described in more detail. Each cell 120 generally includes a reservoir 230, a shelf 240, and a sample receptacle 250. The cell 120 is generally defined by opposite side walls 260, a first end wall 270, a second end wall 280 comprised of a lower wall portion 290 and an upper wall portion 300 joined by the shelf 240, and a bottom wall 310.

The side walls 260 and end walls 270, 280 terminate at the top of the cells 120 in ridges 320. The ridges 320 include top walls 330 that define a second plane that is parallel with and extends above a first plane defined by the top wall 190 of the base. When a cover is applied to the top of the tray 100, the cover is supported by the ridges 320. The cover seals each cell 120 along the cell's surrounding ridge 320 and isolates the cell 120 from adjacent cells 120. The space between adjacent ridges 320 is preferably just wider than a blade of a cutting instrument for selectively cutting the cover around one or more select cells 120 in the tray 100 to access the crystallized substance in the cell(s) 120 without disturbing the cover for adjacent cells 120. Widening the ridges 320, causing the space between adjacent ridges 320 to be narrower, creates a better top wall sealing surface around the cells 120 for the cover and creates a better, more defined cutting path for the blade of the cutting instrument.

The reservoir 230 is preferably a generally rectangular block-shaped void. In a preferred embodiment, the reservoir 230 is sized to accommodate approximately 100 uL of equilibrating solution. In alternative embodiments, the reservoir 230 may have a different configuration and/or may be sized to accommodate other volumes of equilibrating solution.

With reference to FIG. 4, the sample receptacle 250 is preferably cup-shaped with a flat bottom surface 340. The flat bottom surface 340 allows for optical clarity for viewing the drop, and the size of the sample receptacle 250 helps to keep the sample solution held together in a tight drop and prevents spreading of the drop. This makes the sample receptacle 250 appropriate for both macromolecule crystallography and for more general crystallography. This also keeps the drop centered, in a consistent position for visualization with a microscope. The sample receptacle 250 is preferably sized to accommodate a 2 μl sample drop. Sizing the sample receptacle this small is advantageous because it limits where the sample is in the receptacle, making it easier to locate for visualization, removal, etc. The flat bottom surface 340 of the sample receptacle 250 is curved at the edge where it meets the side wall of the sample receptacle 250, allowing for a crystallization sample retrieving device (e.g. nylon fiber microloop connected to shaft) to be used to smoothly scoop the crystal out of the well without jarring the crystal against the side wall.

Preferably, the ratio of the reservoir volume to the sample receptacle volume is at least large enough to create an appropriate gradient to drive the concentration of the protein drop high enough to cause the protein to crystallize. Those of ordinary skill in the art are aware that the larger the reservoir volume, as compared to the sample receptacle volume, the steeper the gradient will be. This allows for more reproducibility, and the easiest way to determine the likeliness that the crystallization step has been driven to completion. The ratio, however, is preferably within a practical range that allows for high-throughput crystallization. Thus, the ratio of the reservoir volume to sample size may be, for example, at least about 500:1, preferably at least about 100:1, preferably at least 75:1, more preferably at least about 50:1, preferably at least about 40:1, and preferably at least about 25:1. In one preferred example, the reservoir is sized to accommodate an equilibrating solution volume of about 100 μl and the sample receptacle is sized to accommodate a sample volume of about 2 μl.

With reference back specifically to FIG. 2, the shelf 240 carries the sample receptacle 250 adjacent one of the side walls 260 and includes a flat upper surface 350. A majority portion 360 of the flat upper surface 350 is located between the sample receptacle 250 and opposite side wall 260. As used herein, "majority" means greater than 50%. When the tray 100 is oriented in the standard position shown in FIG. 2 so that the A-1 cell 210 is the upper-left corner of the tray 100 (i.e., beveled corner 200 is upper-left corner of tray 100), the majority portion 360 of the flat upper surface 350 is located away from the user with respect to the sample receptacle 250 It has been determined by the inventor of the present invention that locating the flat surface of the shelf 240 in this position is ideal for right-handed users (right-handed users are statistically more common than left-handed users) because it allows the crystallized sample to be easily moved forward onto the flat surface of the shelf 240 with a crystallization sample retrieving device (e.g. nylon fiber microloop connected to shaft). It has been determined that this is more convenient for the user than drawing or dragging the crystallized sample rearward, towards the user. Further, when the tray 100 is oriented in the position shown, the shelf 240 is located on the left side of the cell 120. Because the crystallization sample retrieving device is typically operated by the right hand of a right-handed user, locating the shelf 240 on the left side of the cell 120 allows for easier access to the sample receptacle 250 and shelf 240 with the crystallization sample retrieving device. The majority portion 360 of the flat upper surface 350 of the shelf 240 may serve as a cryoprotection holding area for the crystallized sample between crystallization and X-ray diffraction. It is important to cryoprotect the crystallized sample after crystallization and before X-ray diffraction. Instead of having to remove the crystallized sample from the cell and cryoprotect outside of the cell, this can be done in the holding area, within the cell 120. Providing a cryoprotection holding area is important because once the crystallized sample is removed from the cell 120, it may quickly deteriorate in the air because a macromolecule crystal is about 50% solvent and prone to dehydration.

The majority portion 360 of the flat upper surface 350 may also hold a sample drop in addition to, or instead of, the receptacle 250. This may be desirable for performing, in each cell, two different experiments with the same type of sample or different types of samples, or a single experiment with the sample only placed on the shelf 240. Because the shelf 240 is flatter than the receptacle 250, the drop spreads out more when placed on the shelf 240, increasing the surface-to-volume ratio of the drop, changing the kinetics of the equilibrium experiment.

In use, the tray 100 is oriented in the standard position shown in FIG. 2 so that the A-1 cell 210 is the upper-left corner of the tray 100 (i.e., angled corner 200 is upper-left corner of tray 100). Each reservoir 230 is carefully filled with a selected equilibrating solution. Different equilibrating solutions can be added to each of the reservoirs 230 if this is desired. Typically, aqueous mixtures of buffer, salts, and precipitants such as polyethylene glycol or ammonium sulfate are used as precipitating agents in the equilibrating solution. This solution may contain other components such as organic molecules or other additives. Preferably, approximately 100 μl of equilibrating solution is added to each of the reservoirs 230. In alternative embodiments, the amount of equilibrating solution added to each of the reservoirs 230 may be greater than 100 μl, less than 100 μl, different amounts of equilibrating solution may be added to the reservoirs 230, and/or different types of equilibrating solution may be added to the reservoirs 230.

Following the addition of the equilibrating solution to the reservoirs 230, a selected macromolecule (e.g., protein) solution drop is deposited within each sample receptacle 250. The drop is preferably approximately 2 μL and includes a protein in a buffered salt solution containing a lower concentration of the same precipitating agent used in the equilibrating solution. Usually, a concentrated protein solution is mixed with the equilibrating solution to obtain the final total volume of, for example, 2 μl. The ratio of protein to equilibrating solution may be varied, and may be, for example, 1:1.

It is to be understood that the equilibrating solution as well as the macromolecule solution drops may be added to the cells 120 either by hand or by a sophisticated automated pipetting apparatus which is readily commercially available. Because of the novel construction of the tray 100 and the systematic placement of the reservoirs and receptacles, the tray 100 is readily adaptable to most commercially available pipetting systems.

Once the equilibrating solution and protein drops have been added to the apparatus in the manner described, the cover is carefully placed over the tray 100 so that the top walls 330 of the ridges 320 are positively sealed relative to atmosphere. The tray is designed to provide effective sealing between the top walls 330 and the under surface of the cover, using adhesive tape or a plate sealer. Alternatively, a layer of grease, such as silicon grease, or petroleum jelly, may be applied manually or automatically to the top walls 330 of the ridges 320, and some other clear, impermeable layer plated over the tray.

Instead of a sitting-drop technique, in an alternative embodiment, a hanging-drop technique may be used for applying the protein drops to the cells 120. The protein drops may be applied to an undersurface of the cover (with the undersurface face up), and the cover may be inverted and the undersurface sealed against the top walls 330 of the ridges 320 so that the protein drops are hanging into the cells 120.

With either technique, each protein drop is positively sealed within each reservoir cell 120 and can equilibrate against the particular equilibrating solution that was earlier deposited into the particular reservoir 230. Since the starting concentration of precipitating agent is always higher in the reservoir 230 than in the protein drop, once the cell 120 is sealed, water will diffuse from the protein drop to the reservoir 230 until the concentration of precipitating agent at equilibrium is the same in the drop as in the reservoir 230. In general, this diffusion results in a controlled steady increase in the concentration of both the protein and precipitating agent within the drop which forces the protein to come out of solution, hopefully as a crystal. Or, in the instance where there is a dilution effect, where the buffer that is in the protein sample is more concentrated than in the reservoir, the protein is said to "salt into solution" and the crystallization drop tends to grow.

Because the tray 100 is made of an optically clear material, the crystallization of each sample may be viewed using a microscope or other visualization apparatus.

Following crystallization of the protein drops, the cover of the tray 100 is removed. As described above, a blade may be used between the ridges 320 to cut the cover into one or more cover segments that may be individually removed from the top wall 330 of the ridge 320. After removal of the cover segment(s), the crystals are preferably moved onto the majority portion 360 of the flat surface 350 of the shelf 240 with the crystallization sample retrieving device. The flat surface 360 may serve as a cryoprotection holding area for the crystal. A cryoprotectant may be added to the shelf 240 before or after, preferably before, the crystallized sample is moved to the majority portion 360 of the shelf 240. The crystallized sample may then be swept through the cryoprotectant. As indicated above, moving the crystallized sample to the cryoprotection holding area before removing the sample from the cell 120 helps preserve the crystallized protein. From the flat surface 360, each crystal may be removed from the cell 120 with the crystallization sample retrieving device and analyzed through X-ray diffraction. In alternative embodiments, the crystals may be analyzed within the tray 100, the crystals may be removed directly from the receptacles 250 or removed in another manner, and/or the crystals may be analyzed by a technique other than X-ray diffraction.

Because the crystallization tray 100 includes a rectangular array of ninety-six crystallization cells 120, the user may simultaneously screen up to ninety-six different combinations of factors that affect crystallization. Additionally, the number of factors that can be simultaneously tested can be increased by placing an additional sample drop on the flat majority portion 360 of the shelf 240.

Thus, the crystallization tray 100 offers many advantages over crystallization trays in the past, some of which are summarized below. The shelf 240 provides a cryoprotection holding area and additional flat sample holding surface for performing an additional and/or different type of crystallization experiment in the cell 120. The shape of the sample receptacle 250 maintains the sample drop held together, in a tight drop, and prevents spreading of the drop. The small size of the sample receptacle 250 makes it easy to locate the crystallized sample in the receptacle 250. The configuration of the shelf 240 makes it ideal for right-handed users to access, move, and/or remove the crystallized sample. The three knobs 220 on the top wall 190 of the tray 100 help for orientation and calibration of the tray 100. The cut corner 200 also helps for orienting the tray 100 and quickly identifying the first cell in the array. The raised, rectangular ridges 320 provide a sealing support surface for the cover(s), allow the cover(s) around individual cells 120 to be selectively removed without disturbing the cover(s) on adjacent cells 120, and allow access between ridges for cutting away the cover(s) around one or more selected cells. The flat bottom 340 of the sample receptacle 250 allows for ease of imaging. The curvature of the angle between the walls and the bottom of the sample receptacle 250 is suitable for sweeping out the crystallized sample with a mounting loop.

It will be readily apparent to those skilled in the art that still further changes and modifications in the actual concepts described herein can readily be made without departing from the spirit and scope of the invention as defined by the following claims.

What is claimed is:

1. A method of forming macromolecular crystals, comprising the steps of:

providing a macromolecule crystallization tray including a plurality of crystallization cells, each cell including a reservoir adapted to receive a equilibrating solution, a shelf located adjacent to the reservoir and adapted for use as at least one of a sample drop holding area and a temporary cryogenic holding area for a crystallized substance, and a sample drop receptacle within the shelf and adapted to receive a sample drop including a crystallizable substance;

dispensing a equilibrating solution in the reservoirs;

dispensing a plurality of macromolecular solution droplets in the sample drop receptacles;

coveting the cells with a cover; and crystallizing the crystallizable substance by vapor diffusion.

2. The method of claim 1, further including moving the crystallized substance from the sample drop receptacle to the shelf, and contacting the crystallized substance with a cryoprotectant.

3. The method of claim 2, wherein the shelf is flat, includes opposite ends, and a majority shelf portion, the sample drop receptacle is located adjacent one of the ends, the majority shelf portion is located between the sample drop receptacle and the opposite end, and the step of moving the crystallized substance includes moving the crystallized substance from the sample drop receptacle to the majority shelf portion of the shelf.

4. The method of claim 1, wherein the sample drop receptacle includes a flat bottom that is optically clear.

5. The method of claim 1, wherein the tray includes a top wall, a ridge extending upwardly from the top wall and delineating each cell, the ridge adapted to support the cover for isolating each cell from ambient and from each other, the method further including using a blade between ridges of adjacent cells to vat the cover around one or more cells, and removing the cover around one or more cells.

6. The method of claim 5, wherein the cells and ridges are rectangular.

7. The method of claim 5, wherein the ridges define spaces between the ridges of adjacent cells, and a width of the ridges is greater than a width of the spaces.

8. The method of claim 1, wherein the tray includes four corners, only one of the corners having a unique configuration to mark the location of a first cell of the plurality of cells and a standard orientation for the tray, and the method further including orienting the tray so that the corner having a unique configuration is in an upper left hand corner of the tray.

9. The method of claim 1, wherein the tray includes ninety-six cells.

10. The method of claim 1, wherein the tray is rectangular.

11. The meted of claim 1, further including stacking the tray on top of another tray.

12. The method of claim 1, wherein the tray includes a rectangular base the carries the plurality of cells, a rectangular skirt surrounding the base, and a step connecting the skirt to the base.

13. The method of claim 1, wherein the shelf includes a first end located closer to the user and an opposite second end located farther away from the user when the tray is in front of the user and the user is looking down at the tray, the shelf further includes a majority shelf portion, the sample drop receptacle is located adjacent the first end, and the majority shelf portion is located between the sample drop receptacle and the opposite second end, aid the method further includes moving the crystallized substance from the sample drop receptacle forward to the majority shelf portion.

14. The method of claim 1, wherein each cell includes a left side and a right side when the tray is in front of the user and the user is looking down at the tray, and each shelf is located on the left side of the cell.

15. The method of claim 1, wherein the tray includes a top wall and three knobs located adjacent three respective corners of the tray, and the method further including orienting the tray using the three knobs.

16. The method of claim 1, wherein the reservoir includes a reservoir volume and the receptacle includes a receptacle volume, and the ratio of the reservoir volume to the receptacle volume is at least about 40:1.

17. The method of claim 1, wherein the reservoir includes a reservoir volume and the receptacle includes a receptacle volume, and the ratio of the reservoir volume to the receptacle volume is at least about 50:1.

18. The method of claim 1, wherein the reservoir includes a reservoir volume and the receptacle includes a receptacle volume, and the ratio of the reservoir volume to the receptacle volume is at least about 75:1.

19. The method of claim 1, wherein the reservoir includes a reservoir volume and the receptacle includes a receptacle volume, and the ratio of the reservoir volume to the receptacle volume is at least about 100:1.

20. The method of claim 1, wherein the reservoir includes a reservoir volume and the receptacle includes a receptacle volume, and the ratio of the reservoir volume to the receptacle volume is sufficient to hold a protein sample and equilibration solution volumes sufficient to drive crystallization of a crystallizable protein to completion.

21. A method of forming macromolecular crystals, comprising the steps of:

providing a macromolecule crystallization tray including four corners and a plurality of rectangular crystallization cells, each cell including a reservoir adapted to receive a equilibrating solution, a shelf located adjacent to the reservoir, at least one sample drop area carried by the shelf to receive a sample drop including a crystallizable substance, each cell including a left side and a right side when the tray is in front of the user and the user is looking down at the tray, each shelf located on the left side of the cell, only one of the four corners having a unique configuration to mark the location of a first cell of the plurality of cells and a standard orientation for the tray, the tray further including a top wall, a ridge extending upwardly from the top wall and delineating each cell, the ridge adapted to support a cover spaced from and parallel to the top wall for isolating each cell from ambient and from each other, orienting the tray so that the corner having a unique configuration is in an upper left hand corner of the tray;

dispensing a equilibrating solution in the reservoirs;

dispensing a plurality of macromolecular solution droplets in the sample drop areas;

covering the cells with a cover so that the cover is spaced from and parallel to the top wall and isolates each cell from ambient and from each other; and crystallizing the crystallizable substance by vapor diffusion.

22. A method of forming macromolecular crystals, comprising the steps of:

providing a macromolecule crystallization tray including a plurality of crystallization cells, each cell including a reservoir adapted to receive a equilibrating solution, a shelf located adjacent to the reservoir, at least one sample drop area carried by the shelf to receive a sample drop including a crystallizable substance, each cell including a left side and a right side when the tray is in front of the user and the user is looking down at the tray, each shelf located on the left side of the cell, the fray further including a top wall, a ridge extending upwardly from the top wall and delineating each cell, the ridge adapted to support a cover spaced from and parallel to the top wall for isolating each cell from ambient and from each other, dispensing a equilibrating solution in the reservoirs;

dispensing a plurality of macromolecular solution droplets in the sample drop areas;

covering the cells with a cover so that the cover is spaced from and parallel to the top wall and isolates each cell from ambient and from each other; and crystallizing the crystallizable substance by vapor diffusion.

* * * * *

UNITED STATES PATENT AND TRADEMARK OFFICE
CERTIFICATE OF CORRECTION

PATENT NO.    : 6,656,267 B2
DATED         : December 2, 2003
INVENTOR(S)   : Janet Newman It is certified that error appears in the above-identified patent and that said Letters Patent is hereby corrected as shown below:

Column 8,
Line 35, delete "coveting" and insert -- covering --;
Line 57, delete "vat" and insert -- cut --;

Column 9,
Line 7, delete "meted" and insert -- method --;
Line 20, delete "aid" and insert -- and --;

Column 10,
Line 39, delete "fray" and insert -- tray --.

Signed and Sealed this

Twenty-ninth Day of June, 2004

JON W. DUDAS
*Acting Director of the United States Patent and Trademark Office*